United States Patent [19]

Reimer

[11] 4,109,300

[45] Aug. 22, 1978

[54] CIRCUIT CARD CONNECTOR AND SUPPORT DEVICE

[75] Inventor: William A. Reimer, Wheaton, Ill.

[73] Assignee: GTE Automatic Electric Laboratories Incorporated, Northlake, Ill.

[21] Appl. No.: 833,639

[22] Filed: Sep. 16, 1977

[51] Int. Cl.² ............................................. H02B 1/02
[52] U.S. Cl. ............................ 361/415; 339/176 MP
[58] Field of Search ...................... 361/399, 415, 413; 339/65, 176 MP; 211/41

[56] References Cited

U.S. PATENT DOCUMENTS

| | | | |
|---|---|---|---|
| 3,008,113 | 11/1961 | Johnson | 361/415 |
| 3,193,791 | 7/1965 | Bock et al. | 339/176 MP |
| 3,932,016 | 1/1976 | Ammenheuser | 361/415 |
| 3,939,382 | 2/1976 | Lucan et al. | 361/415 |

Primary Examiner—David Smith, Jr.

[57] ABSTRACT

A circuit card connector and support device, for supporting and providing electrical connections to two or more printed circuit cards of less than full size within a printed circuit card cage or rack at any position normally occupied by a full sized card. The connector, includes mounting members disposed to mount within a card cage or rack and an arrangement for slidably receiving and electrically connecting to at least one circuit card. The support device, is disposed to receive a second edge of at least one circuit card and includes latching guide members adapted to interlockingly engage the connector and position the support device perpendicular to the front surface of the connector. An indexing projection, on the support device engages the connector locking the support device in position.

8 Claims, 3 Drawing Figures

CIRCUIT CARD CONNECTOR AND SUPPORT DEVICE

BACKGROUND OF THE INVENTION

1. Field of the Invention

This invention relates to mounting arrangements for printed circuit cards or boards in electrical systems and more particularly to connecting and supporting printed circuit cards of different sizes within a card cage or rack.

2. Description of the Prior Art

It is common in present day electronic equipment to utilize modular construction wherein, circuit components are mounted on printed circuit cards, which in turn are held in enclosures such as racks or cages, such as the racks and cages illustrated in U.S. Pat. Nos. 3,184,069; 3,360,689; 3,716,760 and 3,733,523. Presently most known racks or cages come in fixed sizes which are not easily adaptable to accommodate various sizes of printed circuit cards or utilize a building block type of construction requiring substantial manufacturing labor. U.S. Pat. No. 3,184,069 teaches a card cage which can be adjusted to hold printed circuit cards of different sizes, but is limited to holding cards which are all the same size within the entire cage. Other cages such as the one taught by U.S. Pat. No. 3,733,523, are adapted to accept printed circuit cards of different sizes within the same cage, but require the maintenance of substantial numbers of guide support members and ultimately substantial manufacturing labor to produce.

While the above noted patents do teach mounting of printed circuit cards of different sizes, it is desirable in certain situations to accommodate at least two different sized circuit cards within the full size card environment in a simpler and more efficient manner not present in the prior art.

Accordingly, it is the principle object of this invention to provide an easily manufactured connector and associated support device which can be mouunted to a full size circuit card cage and provide for the electrical connnection and support of various sizes of circuit cards at any position normally occupied by a single standard sized printed circuit card.

SUMMARY OF THE INVENTION

In accomplishing the object of the present invention, there is provided as the environment, a card cage of a type to which the invention may be applied. The card cage includes two spaced apart planar end panels between which are mounted two spaced apart supporting guide panels. The supporting guide panels each include circuit card receiving grooves with the grooves extending transversely inward across the inner plane of the guide panels from an open mouth in front of the cage to a closed termination. The grooves are an isoceles trapezoid in cross-section and have a width and depth suitable for slidably receiving the edge of a circuit card. The card cage further includes a pair of connector mounting bars. The bars are mounted adjacent to and at the edge of the closed termination of the guide panels.

The connector, in accordance with the present invention and as viewed from the front, has a plurality of surfaces with a first (front) surface extending longitudinally and adapted to receiving and providing electrical connection to a first edge of at least one circuit card. A generally planar top and base surface in direct opposition to each other and perpendicular to the first surface includes first and second mounting members, respectively. The mounting members are perpendicular to the top and base surfaces and positioned at central locations therein, forming mounting lips. The connector mounting lips are adapted to receive the card cage mounting bars and align the first surface of the connector to a corresponding pair of circuit card receiving grooves such that a circuit card when slidably inserted between the corresponding pair of grooves engages its first edge to the connectors front surface and makes an electrical connection therein. The connector further includes second (left side) and third (right side) surfaces in direct opposition to each other and perpendicular to the front surface wherein each surface includes a longitudinally oriented channel. At least one and preferably a plurality of indexing notches are arranged in a column in a longitudinal direction on the connectors front surface.

The support device of the present invention as viewed from the front, includes a plurality of surfaces with a longitudinally oriented channel on a first (top) surface adapted to receive a second edge of a circuit card and a longitudinally oriented channel on a fourth (bottom) surface in direct opposition and parallel to the top surface, adapted to receive a second edge of a second circuit card. Second (left side) and third (right side) surfaces in direct opposition to each other and perpendicular to the top surface each include deflectable L-shaped latching guide members. The latching guide members are comprised of a first pair and a second pair of legs. Each leg of the first pair of legs extends from the left side and right side surface respectively and each leg of the second pair of legs extends inward and perpendicular from each first leg.

The second pair of legs interlockingly engage the corresponding connector channels allowing the support device to be slidably positionable along the connector with the top surface and the bottom surface of the support device perpendicular to the front surface of the connector. An indexing projection on the support device is so disposed as to engage one of the connector's indexing notches which locks the support device to that position preventing motion when a force is applied perpendicular to the top surface or the bottom surface of the support device.

The support device channels are aligned and parallel to the circuit card receiving grooves such that at least two circuit cards of less than full size can be slidably inserted between a corresponding channel and groove to engage the connectors front surface to make an electrical connection therein. The size of the circuit card being inserted is established by the connector indexing. At any position normally occupied by a single standard size card with one support device attached, a pair of half-sized, or a three quarter and a one quarter sized card can be mounted. Attaching two or more support devices, will allow three or more cards to be easily mounted and connected. The versatility of the device being limited only to providing proper connector indexing for corresponding modular card sizes.

BRIEF DESCRIPTION OF THE DRAWINGS

A better understanding of the invention may be had from a consideration of the following detailed description taken in conjunction with the accompanying drawings in which.

PREFERRED EMBODIMENT OF THE INVENTION

Figure 1:
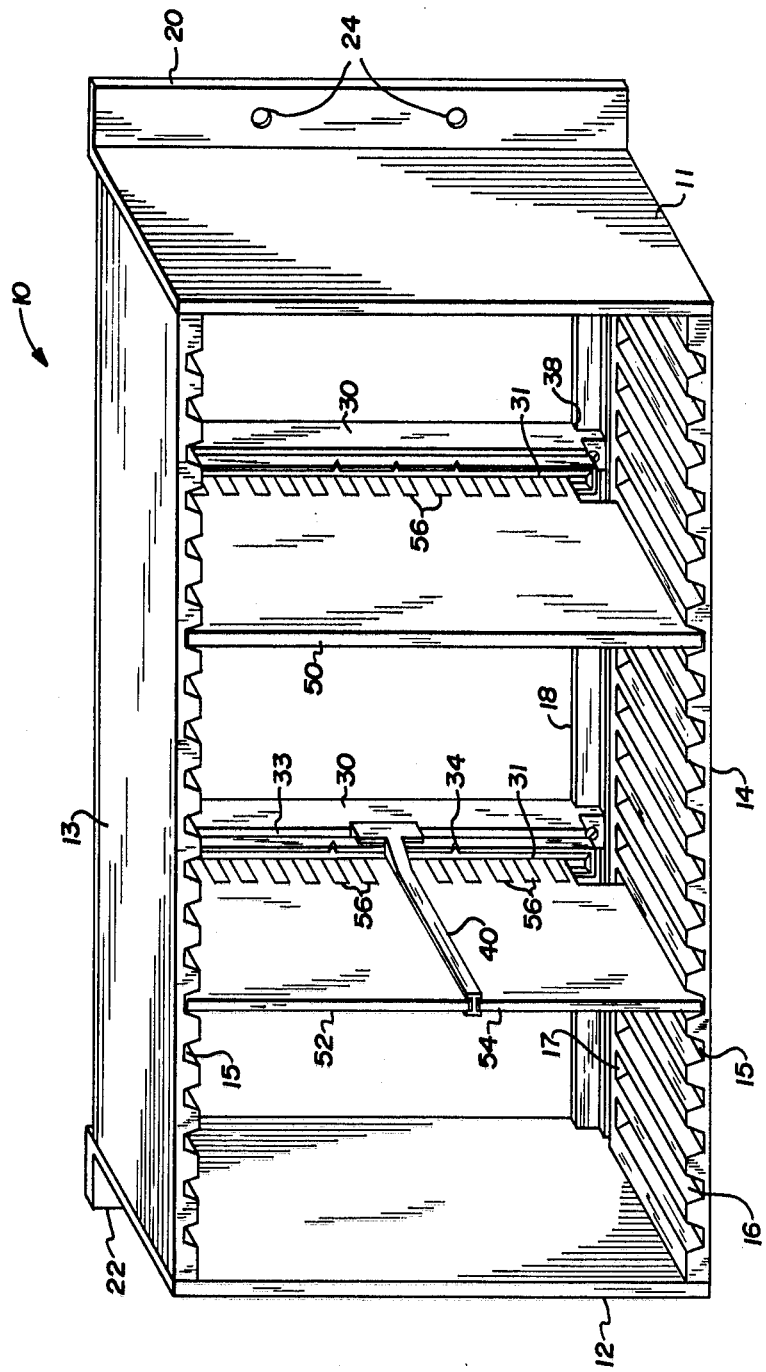
FIG. 1 is a perspective view, of a typical circuit card cage using the connector and support device in accordance with the present invention described herein.

Referring now to the accompanying drawings of the present invention, FIG. 1 illustrates a card cage 10 of the type to which the invention may be applied. It should be understood that the invention may be applied to any of the racks or cages mentioned in the prior art, or any other such racks or cages for the holding of printed circuit cards and the illustration of a card cage 10 in this embodiment forms no part of the invention. The card cage 10 includes two spaced apart planar end panels 11, 12 between which are mounted two spaced apart supporting guide panels 13, 14. Flanges 20, 22 extend outwardly from the end panels 11, 12, respectively, and include holes 24 therein for mounting the card cage assembly 10 to a frame or cabinet (not shown).

The supporting guide panels 13, 14 each include circuit card receiving grooves 15. The grooves 15 extend transversely across the guide panels 13, 14 from an open mouth shown generally at 16 to a closed termination 17. Grooves 15 are generally an isoceles trapezoid in cross section and have a width and depth suitable for slidably receiving the edge of a removably mounted circuit card such as circuit card 50. It should be understood that other supporting guide panels and associated receiving grooves may be employed and those shown in FIG. 1 are for illustrative purposes only.

The card cage 10 further includes a pair of connector mounting bars 18. The bars 18 are mounted adjacent the guide panels 13, 14 and at the edge of the closed termination 18. Only one of the bars 18 is shown. Each bar 18 is adapted to receive a mounting lip 38 of a connector 30 such that a circuit card 50 when slidably inserted between a corresponding pair of circuit card receiving grooves 15 will slidably engage the circuit card receiving channel 31 of the connector 30 and make an electrical connection therein. Although only two connectors 30 are illustrated in the card cage 10 it should be understood that a connector may be mounted between each corresponding pair of circuit card receiving grooves 15.

Figure 2:
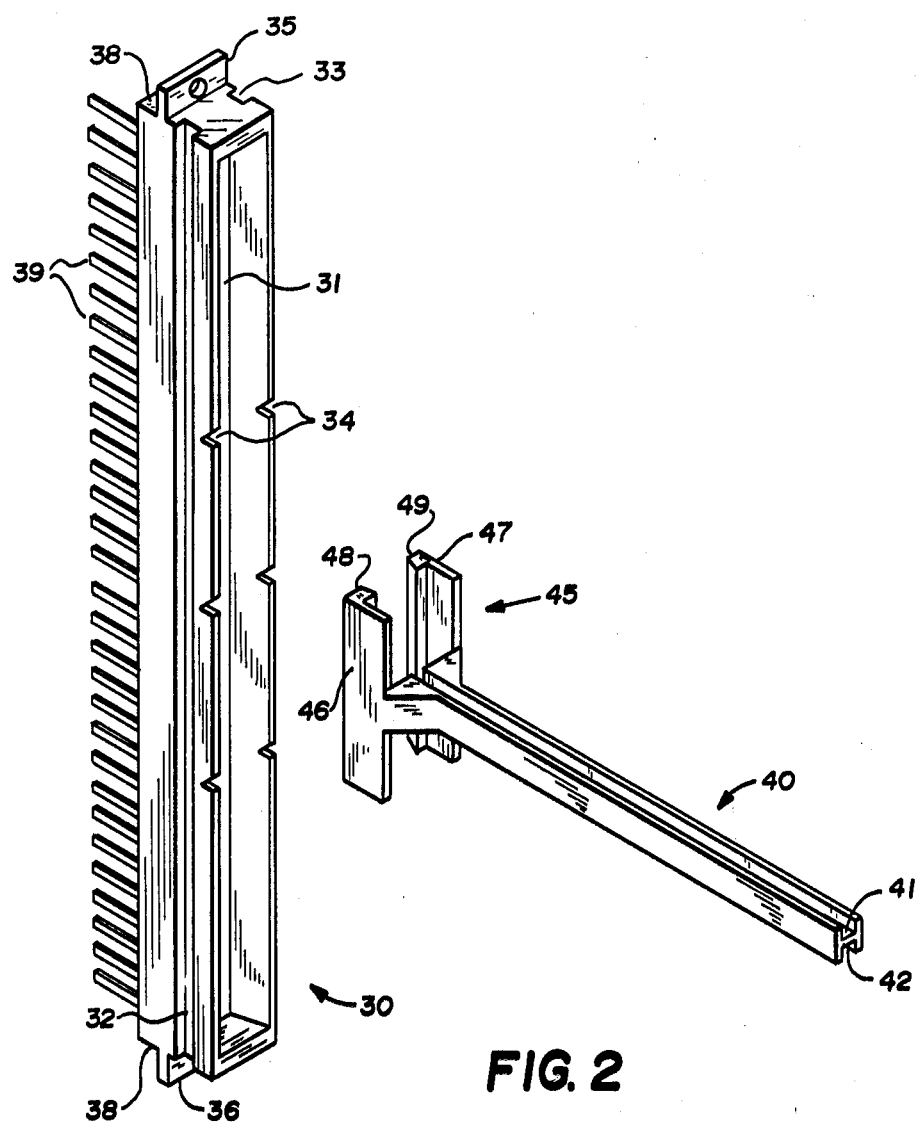
FIG. 2 is a detailed perspective view of the connector and support device in accordance with the present invention as shown generally in FIG. 1.

Turning now to FIG. 2, a connector and support device in accordance with the principles of this invention is illustrated.

The assembly comprises a connector 30 and a support device 40.

The connector 30, as viewed from the front, is comprised of a plurality of surfaces with a first (front) surface extending longitudinally and including a receiving channel 31 adapted to receiving and providing electrical connection to a first edge of at least one circuit card. A generally planar top and base surface in direct opposition to each other and perpendicular to the first surface includes first and second mounting members 35, 36, respectively. The mounting members 35, 36 are perpendicular to the top and base surfaces and positioned at central locations therein, forming mounting lips 38. The connector 30, further includes second (left side) and third (right side) surfaces in direct opposition to each other and perpendicular to the front surface, wherein the left side surface includes a longitudinally oriented channel 32 and the right side surface includes a longitudinally oriented channel 33. A plurality of indexing notches 34 are arranged in a column in a longitudinal direction on the connectors front surface.

The support device 40, as viewed from the front, includes a plurality of surfaces including a longitudinally oriented channel 41 on a first (top) surface adapted to receive a second edge of a circuit card and a longitudinally oriented channel 42 on a fourth (bottom) surface in direct opposition and parallel to the top surface adapted to receive a second edge of a second circuit card. Second (left side) and third (right side) surfaces in direct opposition to each other and perpendicular to the top surface of the support device 40 each include deflectable L-shaped latching guide members 45. The latching guide members are comprised of first legs 46, 47 extending outward from the left side and the right side surface, respectively, and second legs 48, 49 extending inward and perpendicular to first legs 46, 47, respectively. To insure deflectability, the latching guide members 45 are composed of a flexible material.

Figure 3:
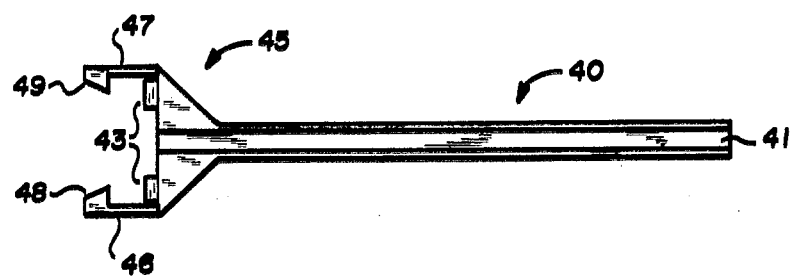
FIG. 3 is a top view of the support device in accordance with the present invention as shown in FIG. 2.

The latching guide member second legs 48, 49 interlockingly engage the corresponding connector channels 32, 33, respectively, allowing the support device to be slidably positionable along the connector with the top channel 41 and the bottom channel 42 of the support device, perpendicular to the receiving channel 31, of the connector 30. An indexing projection 43 as shown on FIG. 3, on the support device, is so disposed as to engage one of the connector's indexing notches 34 which locks the support device 40 to that position preventing motion when a force is applied perpendicular to the top surface or the bottom surface of the support device 40.

Returning to FIG. 1 the support device 40, when properly indexed and latched to connector 30, provides an electrical connection and support to circuit cards of less than full size, such as cards 52, 54. Cards 52, 54 are supported by slidably inserting a second edge and a third edge between the support device 40 and a corresponding circuit card receiving groove 15, respectively, with the first edges of cards 52, 54 making an electrical connection within the connector 30 receiving channel 31. The first edge of circuit cards 50, 52, 54 have pin connections 56 printed thereon, which slide into receiving channel 31 of connectors 30, to form plug electrical connections internally. Corrresponding pins 39 on the opposite side of connectors 30 receiving channel 31 provide for permanent wiring connections as shown in FIG. 2.

Although the connector and support device as installed in card cage 10 is shown in FIG. 1 as having two cards of less than full size for clarity, combinations of cards of three of more may be realized by the addition of one or more support devices 40 properly indexed and latched to connector 30. The connector 30 and any number of properly indexed and latched support devices 40 may be positioned between any corresponding pair of circuit receiving card grooves 15 of the card cage 10 to allow for connection and support of circuit cards of less than full size at any position normally occupied by a full size circuit card.

The present invention has been described with reference to a specific embodiment thereof, for the purpose of illustrating the manner in which the invention may be used to advantage, it will be appreciated by those skilled in the art that the invention is not limited thereto. Accordingly, any and all modifications, variations, or equivalent arrangements which may occur to those skilled in the art should be considered to be within the scope of the invention.

What is claimed is:

1. A circuit card connector and support device adapted to mount within a printed circuit card cage comprising:
   a connector with a plurality of surfaces, including a first surface with receiving means extending in a longitudinal direction and adapted to provide electrical connection to a first edge of at least one circuit card and second and third surfaces each in direct opposition to each other and each perpendicular to said first surface, said second and third surfaces each further including a longitudinally oriented channel;
   a support device with a plurality of surfaces, including a first surface with a longitudinally oriented channel so disposed as to receive the second edge of said circuit card therein and second and third surfaces each in direct opposition to each other and each perpendicular to said first surface, said second and third surfaces each including guide means arranged to mutually engage said channels on said connector slidably positionable along said channels, said first surface of said support device positioned perpendicular to said first surface of said connector.

2. A circuit card connector and support device as recited in claim 1, wherein said guide means comprises a pair of L-shaped deflectable latching guide members, each of said pair of latching guide members comprising first and second legs, each leg of said pair of first legs extending from said second surface and said third surface of said support device respectively, each said leg in direct opposition to the other, each leg of said pair of second legs extending perpendicular and inward from each leg of said pair of first legs, said second pair of legs being so disposed as to mutually engage corresponding said channels on said connector and be slidably positionable along said channels.

3. A circuit card connector and support device as recited in claim 1, wherein said guide means are composed of a flexible material.

4. A circuit card connector and support device as recited in claim 1, wherein said first surface of said connector includes first indexing means and said support device includes second indexing means adapted to engage said connector first indexing means.

5. A circuit card connector and support device as recited in claim 4, wherein said first indexing means comprises of at least one locking notch and said second indexing means comprises of at least one corresponding locking projection adapted to interlockingly engage said locking notch and to cooperatively prevent motion of said support device when a force is applied perpendicular to said first surface of said support device.

6. A circuit card connector and support device as recited in claim 5, wherein said first surface of said connector further includes a plurality of said locking notches arranged in a column in a longitudinal direction and adapted to interlockingly engage at least one of said support device locking projection allowing for a plurality of positions of said support member on said connector and cooperatively prevent motion of said support device when a force is applied perpendicular to said first surface of said support device.

7. A circuit card connector and support device as recited in claim 1, wherein said connector receiving means is adapted to provide electrical connection to a first edge of a second circuit card, said support device further includes a longitudinally oriented channel in a fourth surface thereof, which is disposed to receive a second edge of said second circuit card.

8. A circuit card connector and support device as recited in claim 1, wherein said connector includes a generally planar top and base surface, with said top and base surfaces each in direct opposition of each other and perpendicular to said first surface, said top and base surfaces each include mounting means comprising first and second mounting members respectively, said mounting members centrally positioned and perpendicular to said top and base surfaces forming top and base mounting lips so disposed as to conjoin corresponding internal mounting bar means of said printed circuit card cage.

* * * * *